(12) United States Patent
Kochersperger

(10) Patent No.: US 7,414,701 B2
(45) Date of Patent: Aug. 19, 2008

(54) METHOD AND SYSTEMS FOR TOTAL FOCUS DEVIATION ADJUSTMENTS ON MASKLESS LITHOGRAPHY SYSTEMS

(75) Inventor: Peter Kochersperger, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 815 days.

(21) Appl. No.: 10/677,242

(22) Filed: Oct. 3, 2003

(65) Prior Publication Data

US 2005/0074906 A1   Apr. 7, 2005

(51) Int. Cl.
G03B 27/52 (2006.01)
G02B 26/00 (2006.01)

(52) U.S. Cl. .................................. 355/55; 359/290
(58) Field of Classification Search ............... 355/55, 355/53, 67, 71; 345/697; 359/619, 290
See application file for complete search history.

(56) References Cited

U.S. PATENT DOCUMENTS

| | | | |
|---|---|---|---|
| 4,475,223 | A | 10/1984 | Taniguchi et al. |
| 4,666,291 | A | 5/1987 | Taniguchi et al. |
| 4,737,824 | A | 4/1988 | Sakai et al. |
| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,883,703 | A | 3/1999 | Knirck et al. |
| 5,982,553 | A | 11/1999 | Bloom et al. |
| 6,133,986 | A | 10/2000 | Johnson |
| 6,177,980 | B1 | 1/2001 | Johnson |
| 6,229,871 | B1 | 5/2001 | Tichenor |
| 6,356,340 | B1 | 3/2002 | Spence |
| 6,379,867 | B1 | 4/2002 | Mei et al. |

(Continued)

FOREIGN PATENT DOCUMENTS

EP   1 139 176   10/2001

(Continued)

OTHER PUBLICATIONS

European Search Report for European Appln. 03255906.4, 4 pages, dated Aug. 30, 2004.

(Continued)

Primary Examiner—Peter B Kim
(74) Attorney, Agent, or Firm—Sterne, Kessler, Goldstein & Fox, P.L.L.C.

(57) ABSTRACT

A method and system for correcting optical aberrations in a maskless lithography system. Adjusters move individual spatial light modulators (SLMs) in an SLM array so that the surface of the SLM array deviates from a flat plane. The deviation compensates for aberrations in the lithography system, such as total focus deviation. In an embodiment, an individual SLM can be tilted, bent, and/or have its elevation changed. Multiple SLMs in the SLM array can move in different ways depending on the compensation to be made. The adjusters can be either actively or passively controlled. The method may be performed only during initial setup of the maskless lithography system, periodically as needed for maintenance of the lithography system, or prior to each exposure in the lithography system.

28 Claims, 11 Drawing Sheets

U.S. PATENT DOCUMENTS

| | | |
|---|---|---|
| 6,416,908 B1 | 7/2002 | Klosner et al. |
| 6,433,917 B1 | 8/2002 | Foong et al. |
| 6,509,955 B2 | 1/2003 | Mei et al. |
| 6,617,082 B2 | 9/2003 | Hutchinson |
| 6,618,185 B2 | 9/2003 | Sandstrom |
| 6,687,041 B1 | 2/2004 | Sandstrom |
| 6,696,008 B2 | 2/2004 | Brandinger |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2003/0210383 A1 | 11/2003 | Jain et al. |
| 2004/0041104 A1 | 3/2004 | Liebregts et al. |
| 2004/0130561 A1 | 7/2004 | Jain |
| 2005/0007572 A1 | 1/2005 | George et al. |
| 2005/0046921 A1 | 3/2005 | Govil et al. |
| 2005/0068510 A1 | 3/2005 | Bleeker et al. |

FOREIGN PATENT DOCUMENTS

| | | |
|---|---|---|
| EP | 1 271 247 A1 | 1/2003 |
| EP | 1 280 007 A2 | 1/2003 |
| JP | 2001-297982 A | 10/2001 |
| WO | WO 98/33096 | 7/1998 |
| WO | WO 98/38597 | 9/1998 |
| WO | WO 02/42825 | 5/2002 |

OTHER PUBLICATIONS

European Search Report for European Appln. 04255638.1, 7 pages, dated Mar. 16, 2005.

Office Action for Japanese Patent Application No. 2004-273338 mailed Jan. 8, 2008, 3 pgs.

Notice of Allowance mailed Jan. 30, 2008 for U.S. Appl. No. 10/946,333, 4 pgs.

METHOD AND SYSTEMS FOR TOTAL FOCUS DEVIATION ADJUSTMENTS ON MASKLESS LITHOGRAPHY SYSTEMS

BACKGROUND OF THE INVENTION

1. Field of the Invention

The present invention is directed generally to lithography. More particularly, the present invention relates to maskless lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles are required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital micromirror device (DMD), a liquid crystal display (LCD), or the like). The SLM includes an array of active areas (e.g., mirrors or transmissive areas) that are individually controlled to form a desired pattern. These active areas are also known in the art as "pixels." A stored control algorithm based on a desired exposure pattern is used to control the pixels. Each pixel in an SLM can vary its optical properties (e.g., amplitude/phase transmittance) in a controllable manner so as to provide a variation of a dose delivered to the wafer surface.

As maskless lithography capabilities increase, the tolerance for error in an exposure decreases. Among the errors present in an exposure are optical aberrations in the exposure optics, which are typically caused by manufacturing and assembly tolerance in the exposure optics. Aberrations can result in total focus deviation, among other exposure errors. Total focus deviation results when a focal length of the exposure optics is not identical in all areas of the exposure beam. In this case, a flat array of SLMs does not focus onto a flat plane at the image or wafer plane. When the optics are changed to correct for the error, movement of the optics components requires great precision. Otherwise, difficulties arise that can introduce additional error into the system. What is needed is a system and method for reducing aberrations without introducing additional error into the maskless system.

SUMMARY OF THE INVENTION

In the present invention, corrections for total focus deviation are made by moving individual SLMs in an SLM array. Instead of aligning all SLMs so that they define a flat SLM array plane, at least one SLM has the capability to deviate from the flat plane. In an embodiment, each SLM in the SLM array occupies a first position. Data is received at the wafer plane (also referred to herein as the image plane) so as to determine a corrective adjustment needed. On the basis of this determination, various SLMs in the SLM array move out of the first position into a second position. Each SLM is moved separately, if at all. This causes the SLM array to deviate from a flat plane.

The movement of an individual SLM from the first position to the second position can involve tilting, changing elevation, or bending. These changes are effected by an adjuster or set of adjusters attached to each SLM. In an embodiment, the adjusters change lengths in order to move their respective SLMs to the second positions. The adjusters may be actively or passively controlled. Actively controlled adjusters may include, for example, pistons. Passively controlled adjusters may include, for example, screws or bolts whose lengths are manually changed.

After individual SLMs have been moved to their second positions, light from an illumination system illuminates the SLM array. The SLM array reflects light through at least one optical system. The light then exposes an object at the image plane.

With the present invention, aberrations such as total focus deviation can be reduced without making high-precision adjustments to lenses in the optical system. Further, correcting aberrations with the SLMs allows a less stringent specification for the optics when the system is built.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit (s) in the corresponding reference number.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Maskless Lithography Systems

Figure 1:
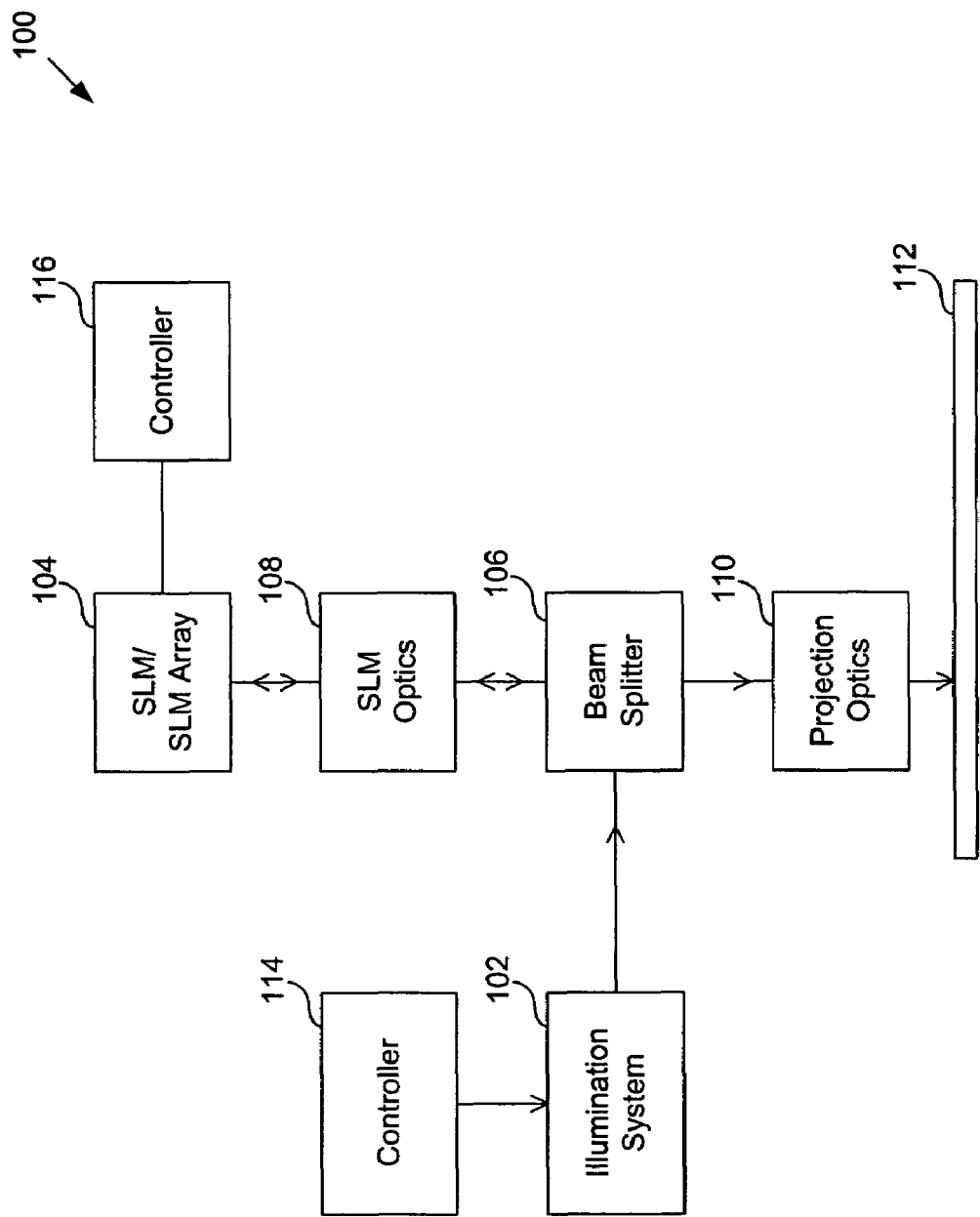
FIG. 1 is block diagram of a maskless lithography system having reflective SLMs, according to embodiments of the present invention.

FIG. 1 shows a maskless lithography system 100 according to an embodiment of the present invention. System 100 includes an illumination system 102 that transmits light to a reflective spatial light modulator (SLM) 104 (e.g., a digital micromirror device (DMD), a reflective liquid crystal display (LCD), or the like) via a beam splitter 106 and SLM optics 108. SLM 104 is used to pattern the light in place of a reticle in traditional lithography systems. Patterned light reflected from SLM 104 is passed through beam splitter 106 and projection optics 110 and written on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that SLM optics 108 and projection optics 110 can include any combination of optical elements required to direct light onto desired areas of SLM 104 and/or object 112, as is known in the relevant art.

In alternative embodiments, either one or both of illumination system 102 and SLM 104 can be coupled to or have integral controllers 114 and 116, respectively. Controller 114 can be used to adjust illumination system 102 based on feedback from system 100 or to perform calibration. Controller 116 can also be used for adjustment and/or calibration. Alternatively, controller 116 can be used for switching pixels 302 on SLM 104 between their discrete states (e.g., between one of their graytone states and the completely dark, or OFF state) (see FIG. 3). This can generate a pattern used to expose object 112. Controller 116 can either have integral storage or be coupled to a storage element (not shown) with predetermined information and/or algorithms used to generate the pattern or patterns.

Figure 2:
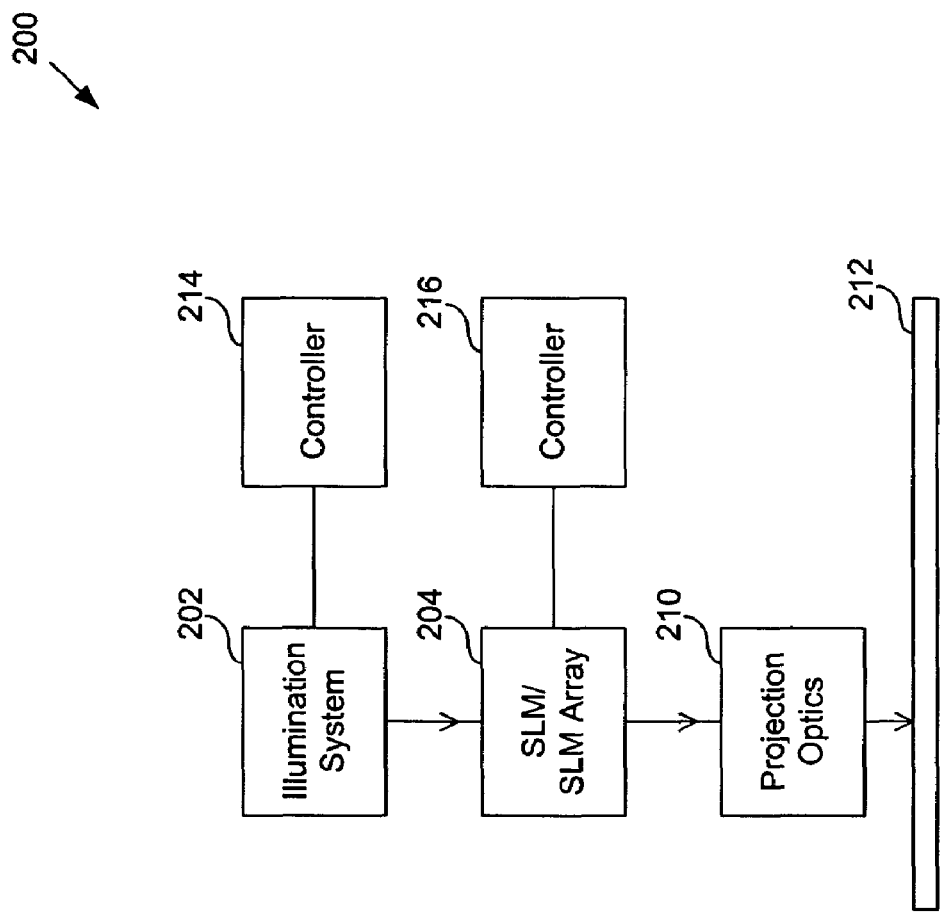
FIG. 2 is a block diagram of a maskless lithography system having transmission SLMs, according to embodiments of the present invention.

FIG. 2 shows a maskless lithography system 200 according to a further embodiment of the present invention. System 200 includes an illumination system 202 that transmits light through an SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination system 202 and SLM 204 can be coupled to or integral with controllers 214 and 216, respectively. Controllers 214 and 216 can perform similar functions as controller 114 and 116 described above, and as known in the art.

Example SLMs that can be used in either of systems 100 or 200 are manufactured by Micronic Laser Systems AB of Sweden and Fraunhofer Institute for Circuits and Systems of Germany.

Merely for convenience, reference will be made only to system 100 below. However, all concepts discussed below can also apply to system 200, as would be known to someone skilled in the relevant arts. Other arrangements or integration of the components and controllers of FIGS. 1 and 2 will become apparent to one of ordinary skill in the art without departing from the spirit and scope of the present invention.

Figure 3:
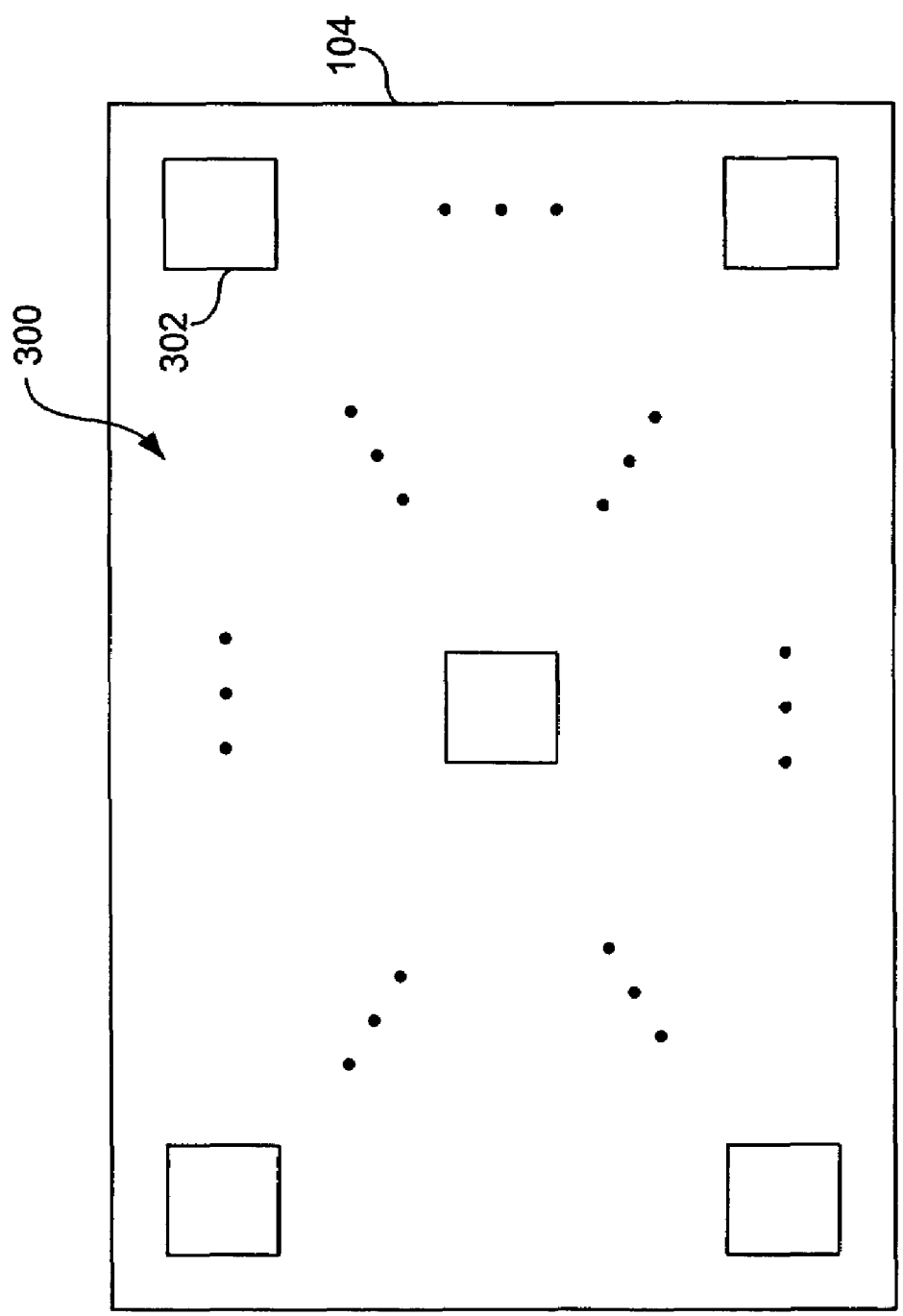
FIG. 3 is an illustration of an SLM, according to an embodiment of the present invention.

FIG. 3 shows details of an active area 300 of SLM 104, for example. Active area 300 includes an n×m array of pixels 302 (represented by squares and series of dots in the figure). Pixels 302 can be mirrors on a DMD or locations on an LCD. By adjusting the physical characteristics of pixels 302, they can be seen as being in one of their states. Digital or analog input signals based on a desired pattern are used to switch states of the various pixels 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
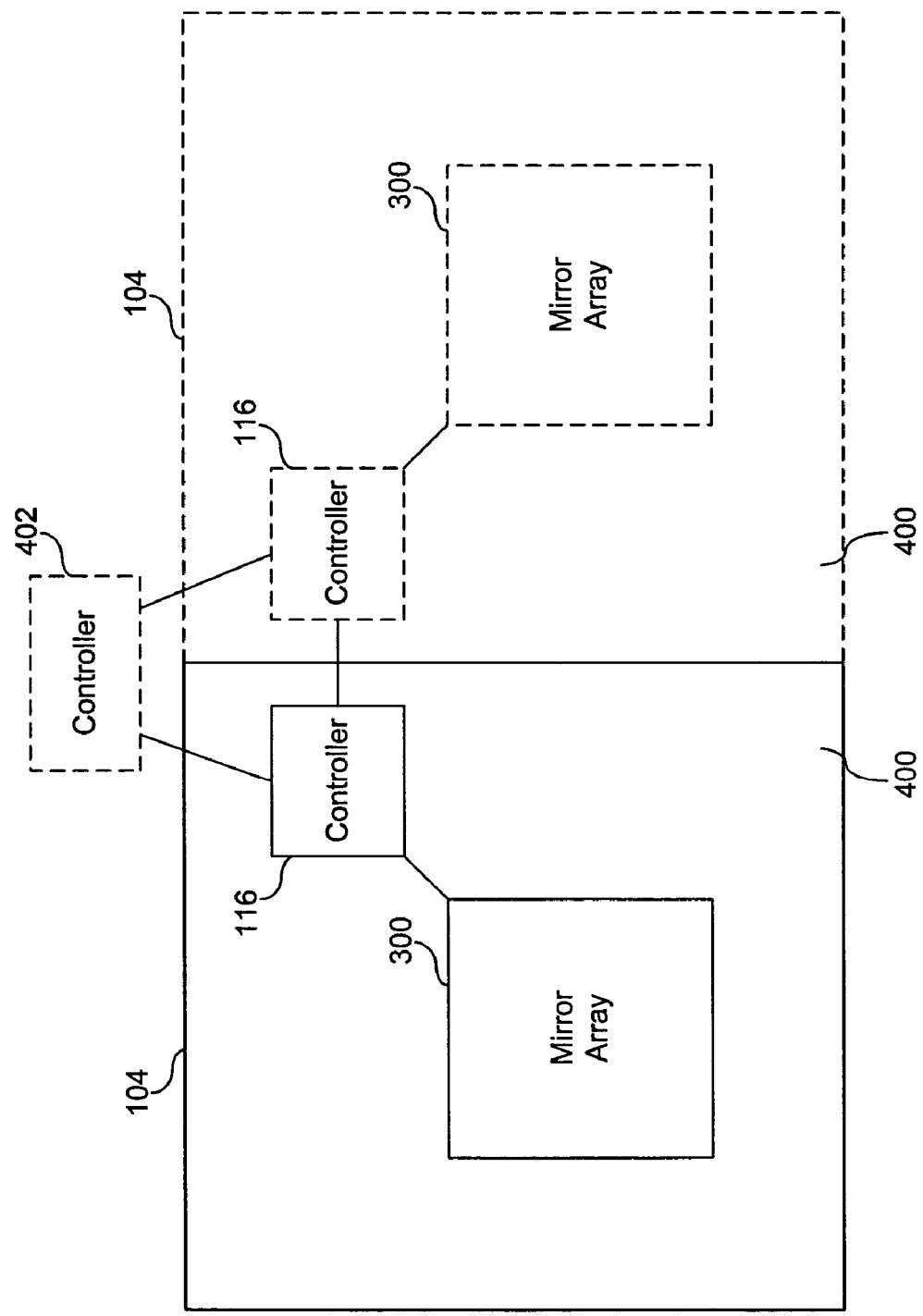
FIG. 4 is an illustration of further details of the SLM in FIG. 3.

FIG. 4 shows further details of SLM 104. SLM 104 can include an inactive packaging 400 surrounding active area (e.g., mirror array) 300. Also, in alternative embodiments, a main controller 402 can be coupled to each SLM controller 116 to monitor and control an array of SLMs. The dashed lines in FIG. 4 represent a second SLM in an array of SLMs. More than one SLM can be added to the array to suit the implementation design. As discussed below, adjacent SLMs can be offset or staggered with respect to each other in other embodiments.

SLM Array Configurations

Figure 5:
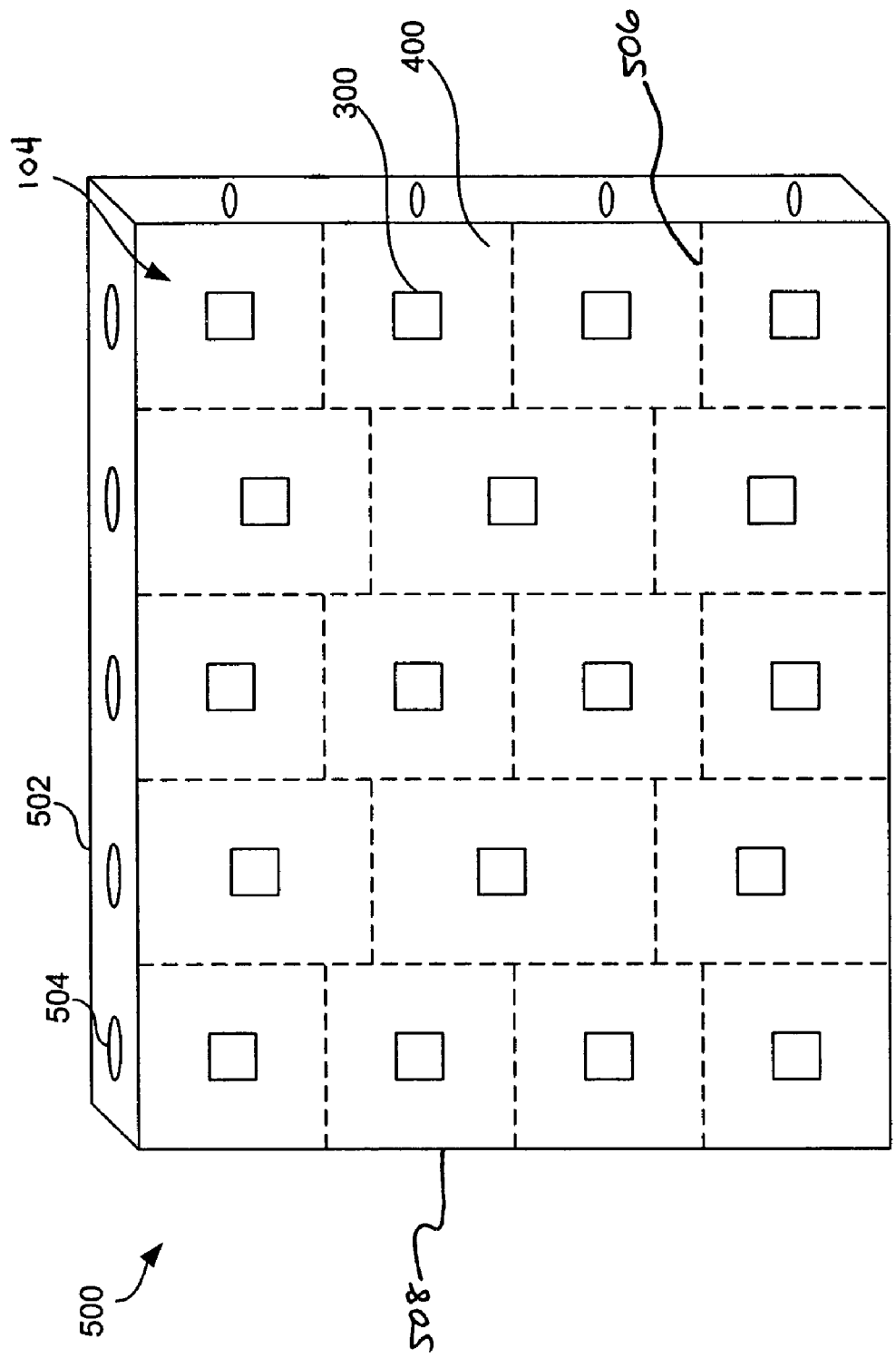
FIG. 5 is an illustration of an assembly according to embodiments of the present invention.

FIG. 5 shows an assembly 500 including a support device 502 that supports or houses an SLM array 508 including a plurality of SLMs 104. In various embodiments, as described in more detail below, SLM array 508 can have varying numbers of columns, rows, SLMs per column, SLMs per row, etc., based on a number of desired exposures per pulse, or other implementation design criteria. The SLMs 104 can be coupled to a support device 502. Support device 502 can have thermal control areas 504 (e.g., water or air channels, structural heat sinks, etc.). Support device 502 can also have areas for control logic and related circuitry (e.g., see FIG. 4 showing elements 116 and element 402, which can be ASICs, A/D converters, D/A converters, fiber optics for streaming data, etc.). In addition, support device 502 can have openings 506 (formed within the dashed shapes) that receive SLMs 104, as is known in the relevant art. Support device 502, SLMs 104, and all peripheral cooling or control device circuitry are referred to as an assembly.

Assembly 500 can allow for a desired step size to produce the desired stitching (e.g., connecting of adjacent elements of features on object 112) and overlap for leading and trailing SLMs 104. A leading SLM is the SLM that produces the first image in a series of images on object 112 during a scan, and a trailing SLM is the SLM that produces the last image in a series of images on object 112 during a scan. Additional SLMs can be present between the leading and trailing SLMs. The overlap of the images from the leading and trailing SLMs 104 from different scans assists in removing seams that may result from adjacent, non-overlapping scans. Support device 502 can be used for thermal management based on being manufactured from a temperature stable material.

Support device 502 can be utilized as a mechanical backbone to ensure spacing control of SLMs 104 and for embedding the circuitry control and the thermal control areas 504. Any electronics can be mounted on either or both of a back side and a front side of support device 502. For example, when using analog-based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when SLM 104 or electrical devices in the circuitry wear out, assembly 500 can easily be replaced. Although it would appear that replacing assembly 500 is more costly than just a chip on assembly 500, it may in fact be more efficient to replace the entire assembly 500, which can save production costs. Also, assembly 500 can be refurbished, allowing for a reduction in replacement parts if end users are willing to use refurbished assemblies 500. Once assembly 500 is replaced, only an overall alignment is needed before resuming fabrication.

In a lithography system, such as system 100, any optical aberration in the system, such as total focus deviation or other focal aberrations, can result in significant error when the light in the system exposes object 112. Although focal aberrations are used herein as an example, it will be apparent to one of skill in the art that other optical aberrations may also be corrected with the present invention. The optics involved with the aberration may be, for example, SLM optics 108 or projection optics 110. One method of correcting a focal aberration is to precisely adjust the relative positions of lenses in the optics, such as projection optics 110 or SLM optics 108. In this way, the flat reticle plane (e.g., the plane of the location of SLM array 508) is projected to a flat object focus plane. However, a lens adjustment may have the negative effect of causing a different aberration that must be corrected by further adjustment of the optics.

In an embodiment of the present invention, focal aberrations are not corrected by moving lenses in the optics. Instead, individual SLMs 104 are moved separately from SLM array 508 to change the focus profile of the projected image. This creates a non-flat reticle plane designed to account for errors in the optics, and project onto a flat object focus plane.

Figure 6:
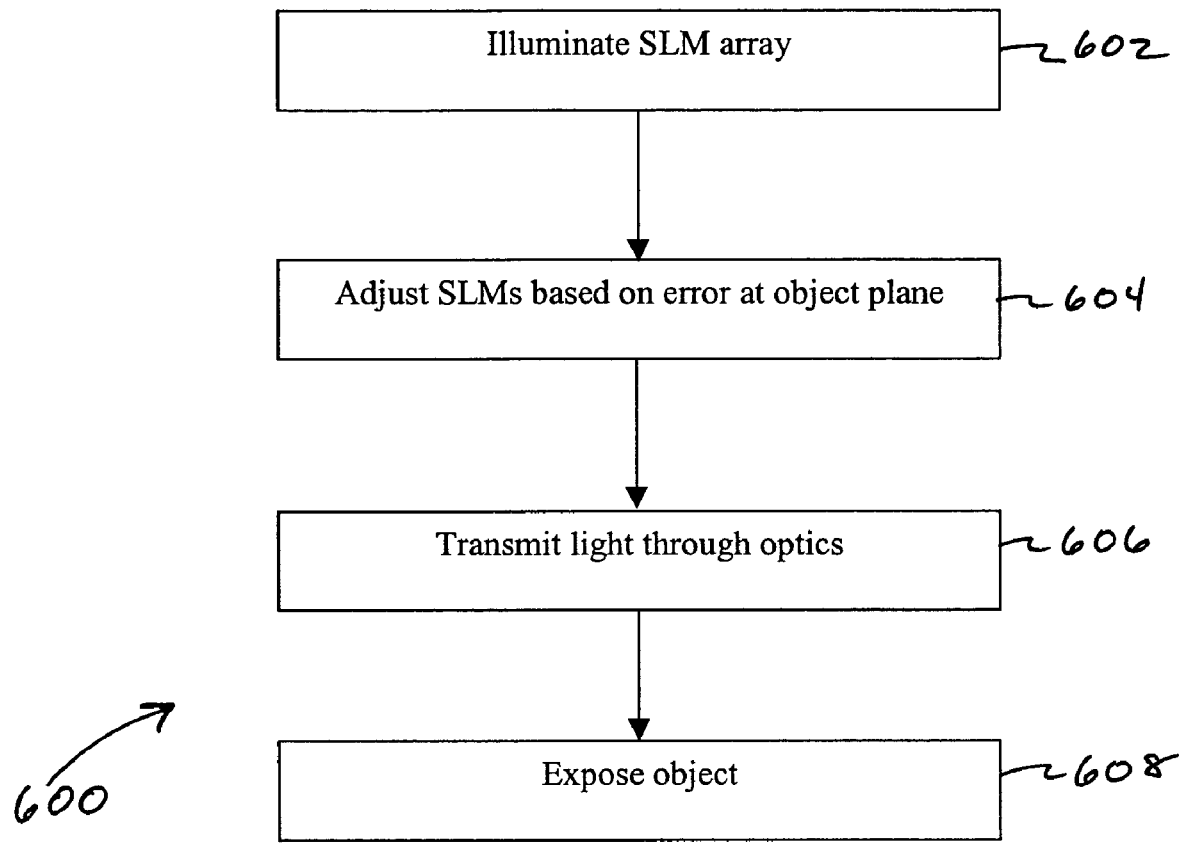
FIG. 6 is a flowchart of a method according to an embodiment of the present invention.

FIG. 6 is a flowchart of an example method 600 according to an embodiment of the present invention. In step 602, an SLM array, such as SLM array 508, is illuminated.

Figure 7:
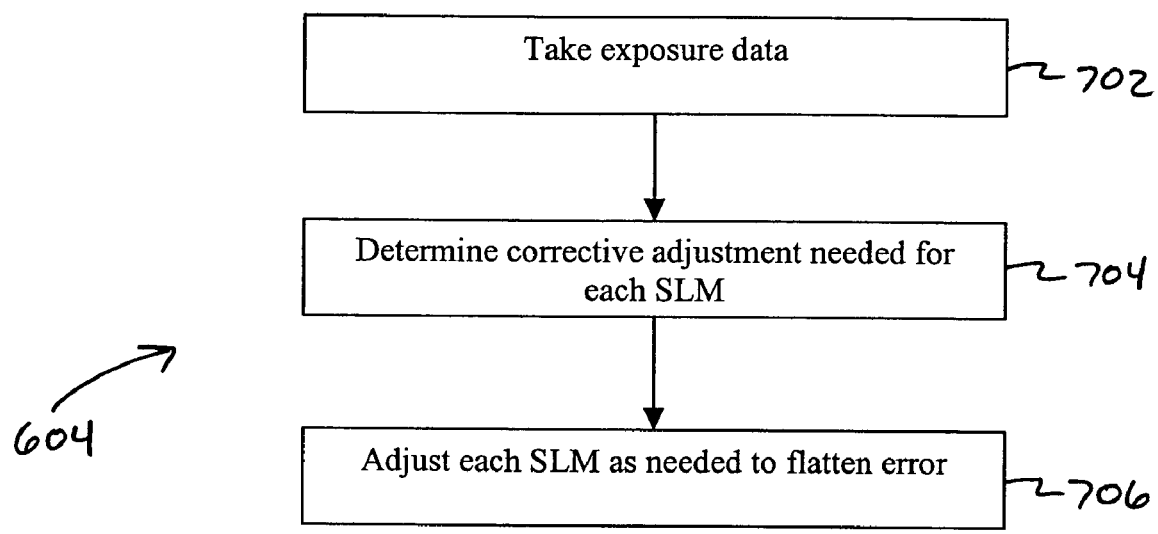
FIG. 7 is another flowchart of a method according to an embodiment of the present invention.

In step 604, the SLMs 104 in SLM array 508 are adjusted based on an error or aberration in the exposure at the plane of object 112. FIG. 7 is a flowchart further detailing an embodiment of step 604. In step 702, exposure data is taken at the image plane. In an embodiment, exposure data is taken with a series of sensors. In an embodiment, exposure data is taken with a series of measurements by one or more sensors, which move within the exposure beam. For example, a detector moves up and down a slit of the exposure beam to determine points, if any, at which the beam is unfocused. In an embodiment, a test object 112 is exposed and then examined to determine the error or aberration data. In step 704, SLM adjustments for each SLM are determined. These adjustments may be required of one or multiple SLMs to correct for the aberration in the exposure. After the amount of adjustment is determined in step 704, each SLM is adjusted in step 706 as needed to flatten or otherwise reduce the aberration. It is possible that some SLMs may need no adjustment. It is also possible that each SLM will need some form of adjustment. Not every SLM is required to be adjusted in the same manner as other SLMs, if at all. Step 604, and thus method 700, may be performed either before or after step 602.

In step 606 of method 600, after the SLMs have been adjusted, light reflected from SLM array 508 is transmitted through the system optics, such as projection optics 110 or SLM optics 108. In step 608, object 112 is exposed.

Method 600 can be performed upon initial setup of the maskless lithography system. Alternatively or additionally, method 600 can be performed periodically as needed for maintenance of the maskless lithography system. Alternatively, method 600 can also be performed before each exposure performed by the maskless lithography system.

Figure 8:
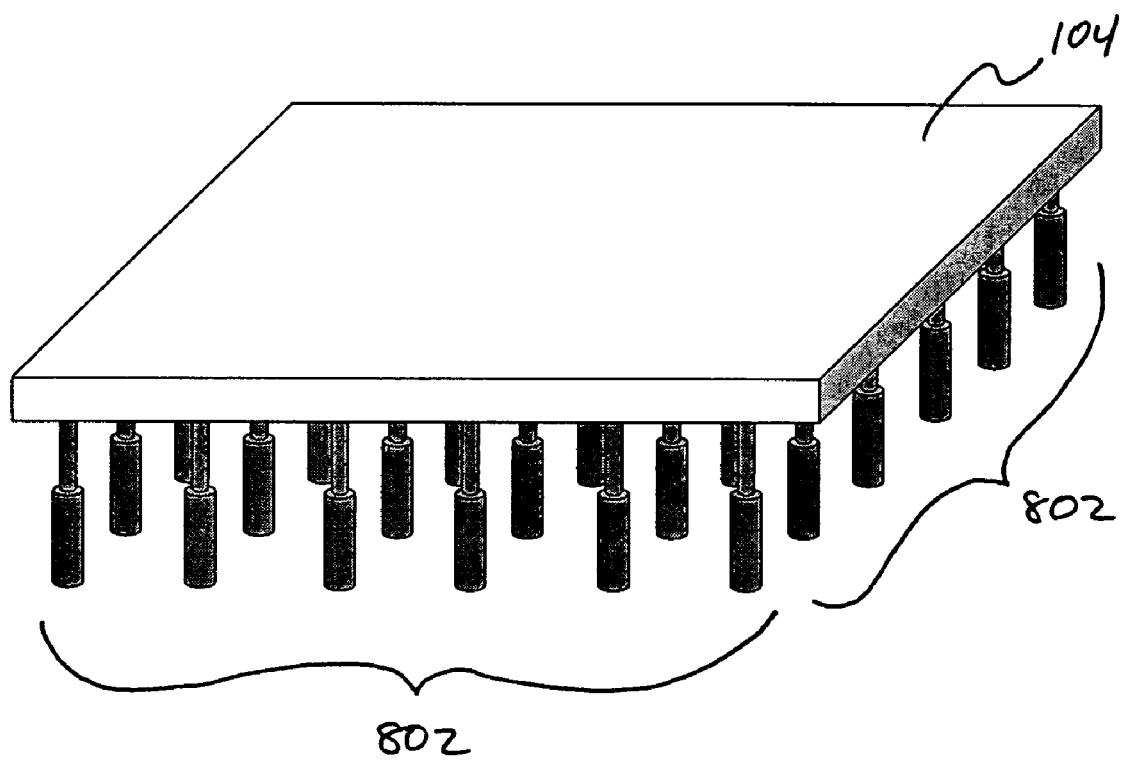
FIG. 8 is an illustration of an SLM having a set of adjusters, according to an embodiment of the present invention.

In order to adjust the individual SLMs 104, each SLM 104 in SLM array 508 may be mounted on an adjuster or a plurality of adjusters. FIG. 8 is an illustration of an example SLM 104 according to this embodiment. In an embodiment, a single adjuster is used for each SLM. In the alternative, as shown in FIG. 8, a plurality of adjusters 802 is attached to SLM 104. Adjusters 802 extend so as to raise and lower parts of the SLM to which they are attached. In an embodiment, adjusters 802 are active in that they are controlled by, for example, commands from a control system. Active adjusters may include, for example, pistons. The length of active adjusters can be changed during a scan. In an embodiment, adjusters 802 are passive in that they are controlled manually. Passive adjusters may include, for example, screws or bolts whose lengths are manually changed.

In an embodiment of the present invention, each SLM 104 is mounted in a coplanar arrangement, such as that shown in FIG. 5. Although the invention is described according to this initial coplanar arrangement, one of skill in the art will recognize that each SLM 104 may also be mounted in an initially non-planar arrangement. Individual SLMs 104 are then moved out of the coplanar arrangement as needed to correct for optical aberrations, such as total focal deviation, at the image plane. Movement of an individual SLM 104 is achieved by changing the lengths of various ones of plurality of adjusters 802 that are attached to the SLM 104.

The movement of SLM 104 caused by adjusters 802 may be one of a planar movement, a tilting movement, or a bending movement, or it may be any combination of the three movements.

Figure 9A:
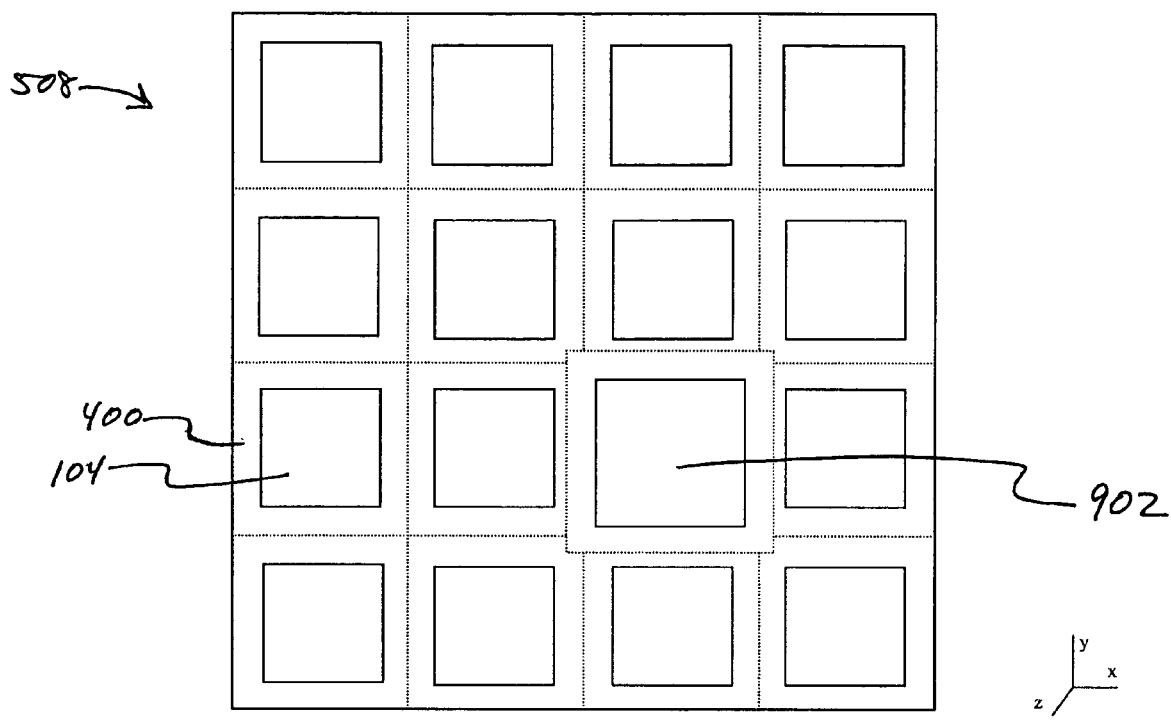
FIG. 9A is a frontal illustration of an SLM array, according to an embodiment of the present invention.
Figure 9B:
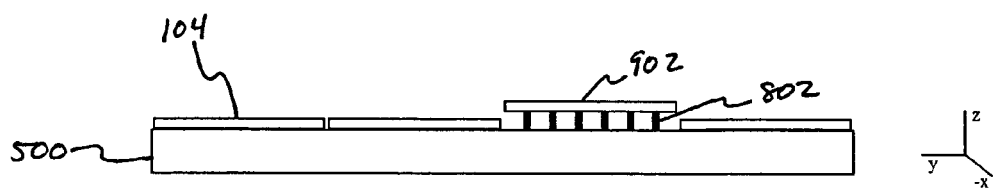
FIG. 9B is a cross-sectional illustration of an SLM array, according to an embodiment of the present invention.

FIGS. 9A and 9B are perspective diagrams showing an embodiment of the present invention. As discussed above with respect to FIG. 5, SLM array 508 can have varying numbers of SLMs per column and per row, and is not limited by the embodiments particularly described herein. In the example of FIG. 9A, SLM array 508 includes 16 SLMs 104 surrounded by inactive packaging 400. In this example, each SLM is the same size, with the rows and columns having an equal number of SLMs. FIG. 9A is a front view of SLM array 508. FIG. 9B is a cross-sectional side view of SLM array 508. In this embodiment, SLM array 508 deviates from a flat plane in that SLM 902 in SLM array 508 is not coplanar with respect to other SLMs 104 in SLM array 508. Instead, plurality of adjusters 802 elevate or de-elevate SLM 902 to a new plane parallel to the plane of SLM array 508. In this manner, optical aberrations in a particular area of the exposure can be corrected without changing the optics.

Figure 10A:
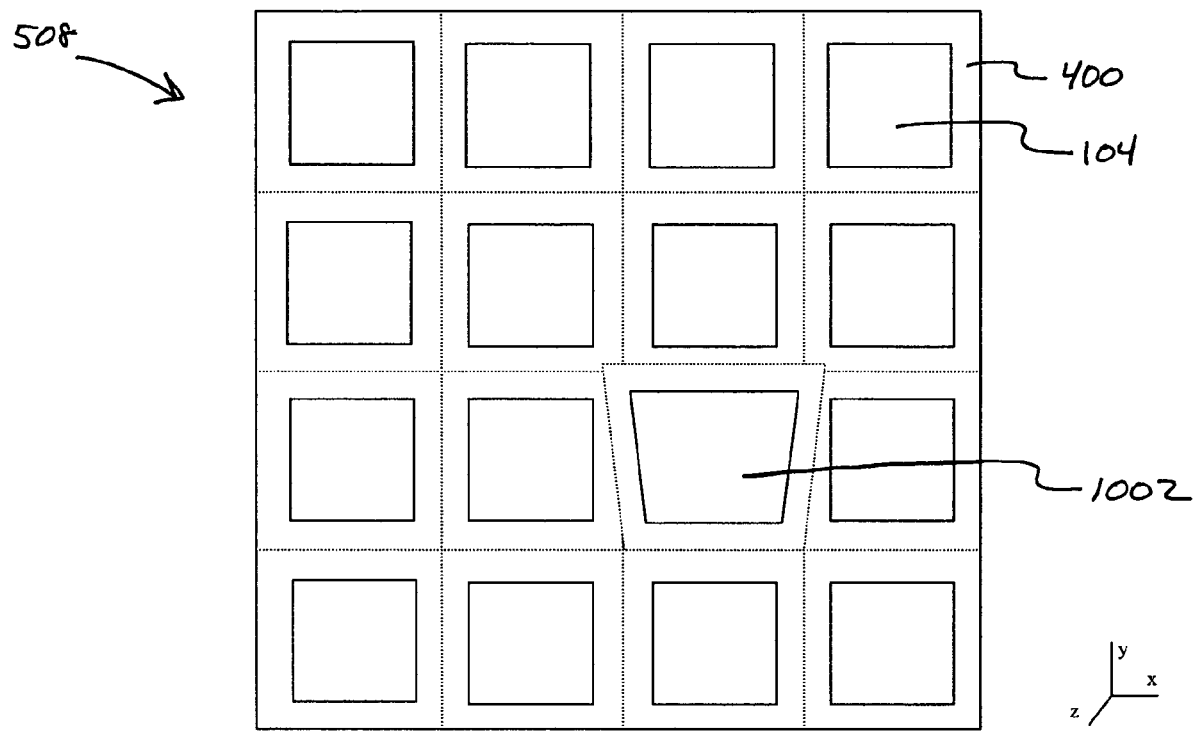
FIG. 10A is a frontal illustration of an SLM array, according to an embodiment of the present invention.
Figure 10B:
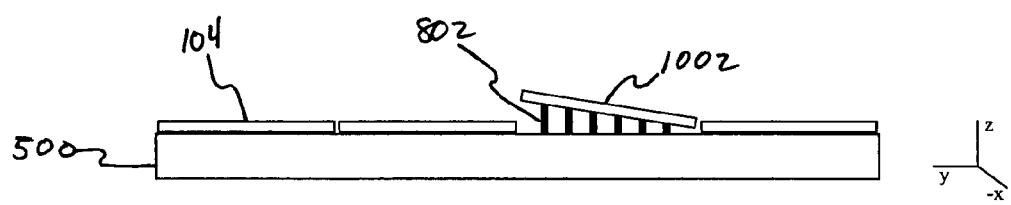
FIG. 10B is a cross-sectional illustration of an SLM array, according to an embodiment of the present invention.

FIGS. 10A and 10B are perspective diagrams showing another embodiment of the present invention. FIG. 10A is a front view of SLM array 508. FIG. 10B is a cross-sectional side view of SLM array 508. In this embodiment, SLM array 508 deviates from a flat plane in that SLM 1002 is tilted with respect to the plane of other SLMs 104 in SLM array 508. In this example, SLM 1002 is tilted in the y direction. One of skill in the art will recognize that SLM 1002 may also be tilted in other directions, such as the x direction. To effect this tilt, plurality of adjusters 802 lengthen in proportion to their respective positions until the desired tilt angle is achieved.

Figure 11A:
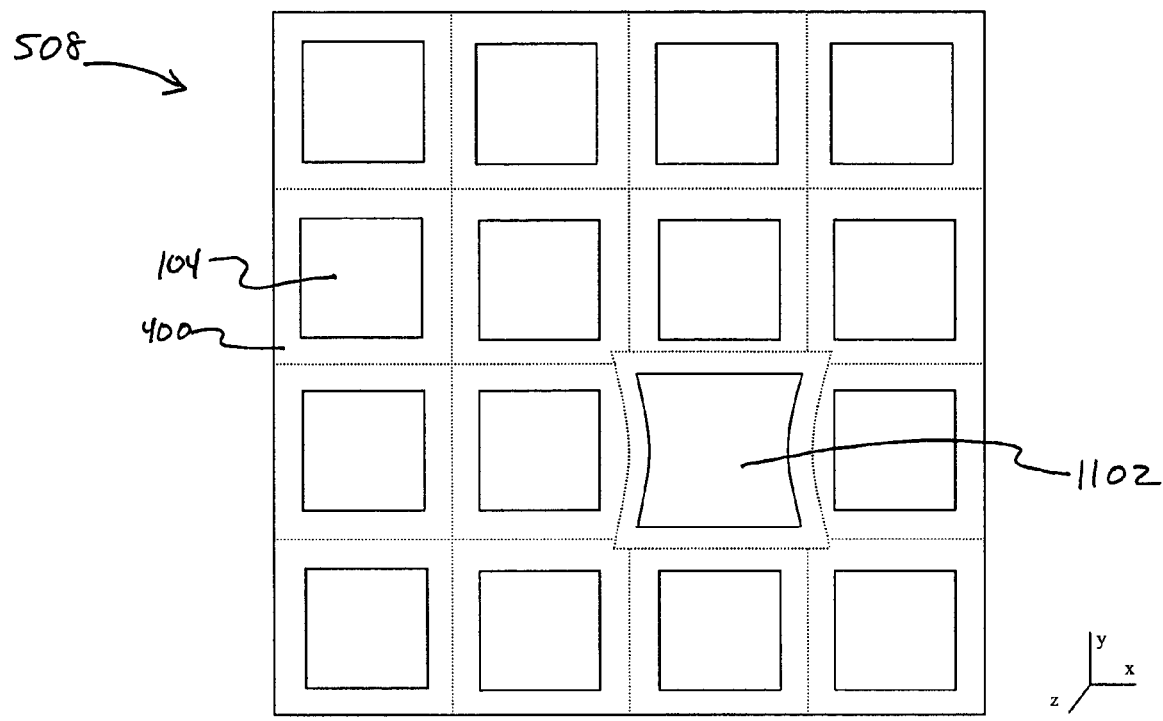
FIG. 11A is a frontal illustration of an SLM array, according to an embodiment of the present invention.
Figure 11B:
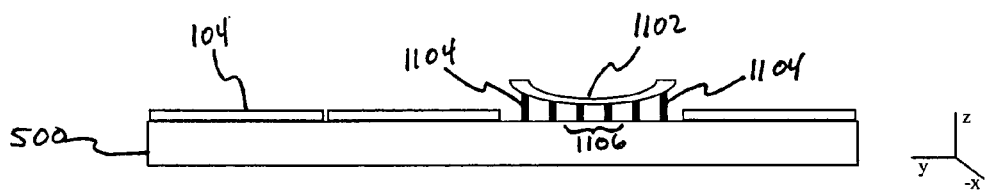
FIG. 11B is a cross-sectional illustration of an SLM array, according to an embodiment of the present invention.

FIGS. 11A and 11B are perspective diagrams showing another embodiment of the present invention. FIG. 11A is a front view of SLM array 508. FIG. 11B is a cross-sectional side view of SLM array 508. In this embodiment, SLM array 508 deviates from a flat plane in that SLM 1102 is bent with respect to the plane of other SLMs 104 in SLM array 508. In the example of FIG. 11B, outer adjusters 1104, in the plurality of adjusters 802, lengthen, while inner adjusters 1106, in the plurality of adjusters 802, lengthen to a lesser extent or otherwise remain short relative to outer adjusters 1104. Each adjuster may have a different length than other adjusters. One of skill in the art will recognize that SLM 1102 may be bent at a variety of places to achieve the desired result. For example, in an embodiment, SLM 1102 may be either convex or concave. In an embodiment, SLM 1102 may be curved on one side and flat on another.

One of skill in the art will recognize that each of the movements described (lifting, tilting, and bending) can be performed either separately or in conjunction with each other. Further, different SLMs in SLM array 508 can move differently than other SLMs in SLM array 508, depending on the amount of focal correction needed at the locations of the different SLMs.

The movement of the individual SLMs 104 causes the surface of SLM array 508 to deviate from a flat plane in a controlled and predictable manner. This deliberate deviation from a flat plane changes the focus profile.

Changing the focus profile at the SLM has several advantages. In systems where focal aberrations are corrected in the system optics, such as, for example, projection optics 110 and SLM optics 108, the changes may result in other optical aberrations. Subsequent adjustments may again negatively affect the light path. Removing the task of focus correction from projection optics 110 and SLM optics 108 to SLMs 104 decreases the amount of precision corrections that must be made to the optics.

Deviating from a flat plane and correcting for focal aberrations at SLMs 104 also allows a less stringent specification for the optics when the system is built. That is, the amount of acceptable error for each lens increases, and the accuracy required of each lens decreases. For example, if an exposure has an overall tolerance of ±100 nm, making adjustments solely in the optical system is both challenging and tedious. However, if the optics are allowed a tolerance of ±500 nm, with the remainder to be corrected by movement of the SLMs, the optics are simpler to design. This decrease in accuracy required by the optics saves time in both the manufacturing stage and the setup stage. Thus, the same error tolerance at object 112, formerly required by the optical system, can be achieved with an optical system designed to less strict specifications by using individual SLMs 104 to compensate for errors in the optics.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of correcting an aberration in a maskless lithography system, comprising:

illuminating a spatial light modulator (SLM) array having a plurality of SLMs, wherein said SLM array defines a first plane;

adjusting a position of at least one SLM in said SLM array from the first plane to a second orientation; and exposing an object with light from the SLM array.

2. The method of claim 1, wherein said first plane is coplanar with at least one other SLM in the SLM array, and said second orientation is not coplanar with the at least one other SLM.

3. The method of claim 2, wherein said second orientation is a second plane.

4. The method of claim 3, wherein said second orientation is parallel to said first plane.

5. The method of claim 3, wherein said second orientation is tilted at an angle with respect to said first plane.

6. The method of claim 2, wherein said second orientation is curved with respect to said first plane.

7. The method of claim 1, wherein the position of said at least one SLM is adjusted to compensate for focal deviation of the light at said object.

8. The method of claim 1, wherein the position of said at least one SLM is adjusted actively.

9. The method of claim 8, wherein the position of said at least one SLM is adjusted using pistons.

10. The method of claim 1, wherein the position of said at least one SLM is adjusted manually.

11. The method of claim 10, wherein the position of said at least one SLM is adjusted using screws.

12. The method of claim 1, wherein said method is performed only during an initial setup of the maskless lithography system.

13. The method of claim 1, wherein said method is performed periodically for maintenance of the maskless lithography system.

14. A method of correcting focal deviation in a maskless lithography system, comprising:
illuminating a spatial light modulator (SLM) array having a plurality of SLMs, wherein each SLM in the SLM array has a first position;
adjusting at least one SLM from said first position to a second position;
transmitting light from the SLM array through an optical system; and
exposing an object with the transmitted light,
wherein said first position is coplanar with the plurality of SLMs in the SLM array, and said second position is not coplanar with the SLM array.

15. The method of claim 14, wherein said second position is parallel to said first position.

16. The method of claim 14, wherein said adjusting step comprises tilting the at least one SLM.

17. The method of claim 14, wherein said adjusting step comprises bending the at least one SLM.

18. A method of correcting an aberration in a maskless lithography system having a plurality of SLMs in an SLM array, said SLM array having a reflective surface, said method comprising:
adjusting a position of at least one of said plurality of SLMs based on said aberration;
illuminating said SLM array;
transmitting light reflected by said SLM array through an optical system; and
exposing an object with said light,
wherein said adjusting step causes the reflective surface of said SLM array to deviate from a flat plane.

19. The method of claim 18, wherein said adjusting step comprises:
receiving exposure data at a plane of said object;
determining corrective adjustment needed for said at least one of said plurality of SLMs, wherein said adjustment is based on said exposure data; and
adjusting said at least one of said plurality of SLMs as needed to reduce said aberration.

20. A maskless lithography system, comprising along a light path:
an illumination source configured to produce light;
a spatial light modulator (SLM) array having a plurality of SLMs, each SLM in the plurality of SLMs being attached to a respective adjuster;
an optics system configured to condition the light; and
an image plane configured to receive the light,
wherein each adjuster moves a respective SLM as needed to correct for an optical aberration in the light received by the object, such that a surface of the SLM array deviates from a flat plane.

21. The system of claim 20, wherein said aberration is total focus deviation.

22. The system of claim 20, wherein said adjuster is a set of adjusters.

23. The system of claim 22, wherein said set of adjusters tilts its respective SLM.

24. The system of claim 22, wherein said set of adjusters bends its respective SLM.

25. The system of claim 22, wherein said set of adjusters changes an elevation of its respective SLM.

26. The system of claim 22, further comprising:
a controller configured to control said adjusters.

27. The system of claim 26, wherein said adjusters are pistons.

28. The system of claim 22, wherein said adjusters are screws.

* * * * *